US008808969B2

(12) United States Patent
Lin et al.

(10) Patent No.: US 8,808,969 B2
(45) Date of Patent: Aug. 19, 2014

(54) METHOD OF MAKING RADIATION-SENSITIVE SOL-GEL MATERIALS

(75) Inventors: Qin Lin, Rolla, MO (US); Yubao Wang, Rolla, MO (US); Tony D. Flaim, St. James, MO (US)

(73) Assignee: Brewer Science Inc., Rolla, MO (US)

( * ) Notice: Subject to any disclaimer, the term of this patent is extended or adjusted under 35 U.S.C. 154(b) by 0 days.

(21) Appl. No.: 13/443,533

(22) Filed: Apr. 10, 2012

(65) Prior Publication Data

US 2012/0264056 A1   Oct. 18, 2012

Related U.S. Application Data

(60) Provisional application No. 61/474,588, filed on Apr. 12, 2011.

(51) Int. Cl.
*G03F 7/26* (2006.01)
*G03F 7/075* (2006.01)
*G03F 7/20* (2006.01)

(52) U.S. Cl.
CPC . *G03F 7/075* (2013.01); *G03F 7/20* (2013.01)
USPC ........................................................ 430/311

(58) Field of Classification Search
CPC ....... G03F 7/075; G03F 7/038; G03F 7/0757; H01L 21/02282; H01L 21/02348; H01L 21/02216; H01L 21/02211; H01L 21/3121; H01L 23/49866
USPC ............................ 430/322, 311, 270.1, 281.1
See application file for complete search history.

(56) References Cited

U.S. PATENT DOCUMENTS

| 5,792,592 | A  | * | 8/1998 | Uchida et al. ................. 430/313 |
| 6,808,867 | B2 |   | 10/2004 | Doshi et al. |
| 7,485,690 | B2 |   | 2/2009 | Hamada et al. |
| 7,674,871 | B2 |   | 3/2010 | Koch et al. |

(Continued)

FOREIGN PATENT DOCUMENTS

| CN | 101130518 | * | 2/2008 |
| EP | 0 816 925 A1 | | 1/1998 |
| KR | 20080107128 | | 12/2008 |
| KR | 20100103987 | | 9/2010 |

OTHER PUBLICATIONS

Liu et al., "Preparation of low refractive index fluorinated materials for antireflection coatings," Journal of Applied Polymer Science, vol. 118, No. 3, 2010, pp. 1615-1619.

(Continued)

*Primary Examiner* — Caleen Sullivan
(74) *Attorney, Agent, or Firm* — Hovey Williams LLP

(57) ABSTRACT

Radiation-sensitive sol-gel compositions are provided, along with methods of forming microelectronic structures and the structures thus formed. The compositions comprise a sol-gel compound and a base generator dispersed or dissolved in a solvent system. The sol-gel compound comprises recurring monomeric units comprising silicon with crosslinkable moieties bonded to the silicon. Upon exposure to radiation, the base generator generates a strong base, which crosslinks the sol-gel compound in the compositions to yield a crosslinked layer that is insoluble in developers or solvents. The unexposed portions of the layer can be removed to yield a patterned sol-gel layer. The invention can be used to form patterns from sol-gel materials comprising features having feature sizes of less than about 1 μm.

13 Claims, 7 Drawing Sheets

(56) References Cited

U.S. PATENT DOCUMENTS

| | | | |
|---|---|---|---|
| 2002/0127498 A1* | 9/2002 | Doshi et al. | 430/322 |
| 2005/0022697 A1 | 2/2005 | Benrashid et al. | |
| 2006/0006541 A1 | 1/2006 | Tsuchiya et al. | |
| 2006/0024980 A1* | 2/2006 | Tsuchiya et al. | 438/789 |
| 2009/0191474 A1 | 7/2009 | Sun et al. | |
| 2010/0080973 A1 | 4/2010 | Son et al. | |
| 2010/0136798 A1 | 6/2010 | Rantala et al. | |
| 2010/0255412 A1 | 10/2010 | Sun | |
| 2010/0261097 A1 | 10/2010 | Sun | |
| 2010/0273321 A1 | 10/2010 | Wang et al. | |
| 2011/0064925 A1 | 3/2011 | Van Bommel et al. | |

OTHER PUBLICATIONS

Neef et al., "Effects of bake temperature and surface modifications on hardmask materials for trilayer applications," Proceedings of SPIE, vol. 6923, 2008, paper No. 692331-1 - 692331-9.

Sun et al., "Bicyclic guanidinium tetraphenylborate: a photobase generator and a photocatalyst for living anionic ring-opening polymerization and cross-linking of polymeric materials containing ester and hydroxy groups," Journal of the American Chemical Society, vol. 130, No. 26, 2008, pp. 8130-8131.

Suyama, et al., "Photobase generators: Recent progress and application trend in polymer systems," Progress in Polymer Science, vol. 34, No. 2, 2009, pp. 194-209.

Liu et al., "Preparation of low refractive index fluorinated materials for antireflection coatings," Journal of Applied Polymer Science, vol. 118, No. 3, 2010, pp. 1615-1619, abstract only.

Neef et al., "Effects of bake temperature and surface modifications on hardmask materials for trilayer applications," Proceedings of SPIE, vol. 6923, 2008, paper No. 692331, abstract only.

Sun et al., "Bicyclic guanidinium tetraphenylborate: a photobase generator and a photocatalyst for living anionic ring-opening polymerization and cross-linking of polymeric materials containing ester and hydroxy groups," Journal of the American Chemical Society, vol. 130, No. 26, 2008, pp. 8130-8131, abstract only.

S. Aubonnet et al., "Photo-patternable optical chemical sensors based on hybrid sol-gel materials," Electronic Letters, Jun. 2003, vol. 39, No. 12, pp. 913-914.

Abdallah et al., "Image Reversal Trilayer Materials and Processing," Proc. of SPIE, 2009, vol. 7520, 75200L-12.

Uraoka et al., "Preparation and Characterization of Methylsilsesquioxane Thin Film Containing Tris(ethylenediamine) cobalt(III) Chloride as a Photobase Generator," Chem. Mater., 2010, vol. 22, No. 22, 6125-6129.

Chemtob et al., "Simultaneous sol-gel and anionic photopolymerization of 3-(glycidyloxypropyl)trimethoxysilane via photobase catalysis," New. J. Chem., 2011, 35, 1803-1808.

Copy of International Search Report and Written Opinion dated Jan. 21, 2013, in corresponding PCT/US2012/033073 filed on Apr. 11, 2012.

* cited by examiner

METHOD OF MAKING RADIATION-SENSITIVE SOL-GEL MATERIALS

CROSS-REFERENCE TO RELATED APPLICATIONS

The present application claims the priority benefit of U.S. Provisional Patent Application Ser. No. 61/474,588, filed Apr. 12, 2011, entitled METHOD OF MAKING PHOTOSENSITIVE SOL-GEL MATERIALS, incorporated by reference in its entirety herein.

BACKGROUND OF THE INVENTION

1. Field of the Invention

The present invention relates to radiation-sensitive, sol-gel coatings that utilize a radiation-sensitive, base generator.

2. Description of Related Art

Sol-gel coatings are used by different industries for various applications, such as protective coatings, optical coatings, dielectric materials, adhesive primers, and spin-on hardmasks for pattern transfer in semiconductor fabrication. Normally, sol-gel coatings must be heated to a high temperature (>250° C.) for a long period of time (>30 minutes) to achieve the best performance. Sol-gel formulations with a high curing efficiency are urgently needed for many applications. Patterned sol-gel coatings are also desirable in many applications.

Sol-gel coatings are usually patterned by pattern transfer from a photoresist. Because the pattern transfer approach is less cost-effective, using directly patternable, photosensitive sol-gel materials is the more favored choice. However, a common approach to making photosensitive sol-gel materials involves incorporating functional groups, such as epoxy or vinyl groups, into the polymer backbone using organic silanes. Those functional groups react with the acid or free radicals produced upon exposing the photoacid generator or photo-generated, free radical producer to light. This approach is inefficient, and large amounts of extra functional groups and catalysts are needed, which adversely affect the physical performance of materials. Sol-gel materials are also known to have a very short pot life or shelf life, which usually means that on-site mixing must be used. Bases can also be used to cure sol-gel materials, however existing patternable sol-gel materials have poor resolution or cannot be used for pattern features smaller than 1 micron. Thus, there remains a need in the art for a sol-gel formulation with a high curing efficiency and shelf-stability, which is also capable of patterning to features smaller than 1 micrometer.

SUMMARY OF THE INVENTION

The present invention is broadly concerned with a method of forming a microelectronic structure. The method comprises providing a substrate having a surface, optionally forming an intermediate layer on the surface, and forming a layer of sol-gel composition adjacent the intermediate layer, if present, or adjacent the substrate surface if no intermediate layers are present, the sol-gel composition comprising a sol-gel compound and a base generator dissolved or dispersed in a solvent system. The sol-gel layer is exposed to radiation to yield exposed and unexposed portions of the sol-gel layer, and the sol-gel layer is contacted with a solvent or aqueous alkaline developer so as to remove the unexposed portions and yield a patterned sol-gel layer, the patterned sol-gel layer comprising a pattern, the pattern comprising features having a feature size of less than about 1 µm.

A radiation-sensitive, sol-gel composition is also provided. The composition comprises a sol-gel compound and an ionic base generator dispersed or dissolved in a solvent system. The sol-gel compound comprises recurring monomeric units comprising silicon and having crosslinkable moieties bonded to the silicon, wherein at least about 80% of the crosslinkable moieties are —OH groups, based upon the total number of crosslinkable moieties taken as 100%.

A microelectronic structure is also provided. The structure comprises a substrate having a surface, an optional intermediate layer adjacent said substrate surface, and a sol-gel layer adjacent the intermediate layer, or adjacent the substrate surface if no intermediate layers are present. The sol-gel layer comprises a sol-gel compound and an ionic base generator dispersed or dissolved in a solvent system. The sol-gel compound comprises silicon and has crosslinkable moieties bonded to the silicon, wherein at least about 80% of the crosslinkable moieties are —OH groups, based upon the total number of crosslinkable moieties taken as 100%.

BRIEF DESCRIPTION OF THE DRAWINGS

Figures (FIGS. 1(A)-(C) are schematic drawings depicting a structure (not to scale) formed by the inventive process.

DETAILED DESCRIPTION

Figure 1:
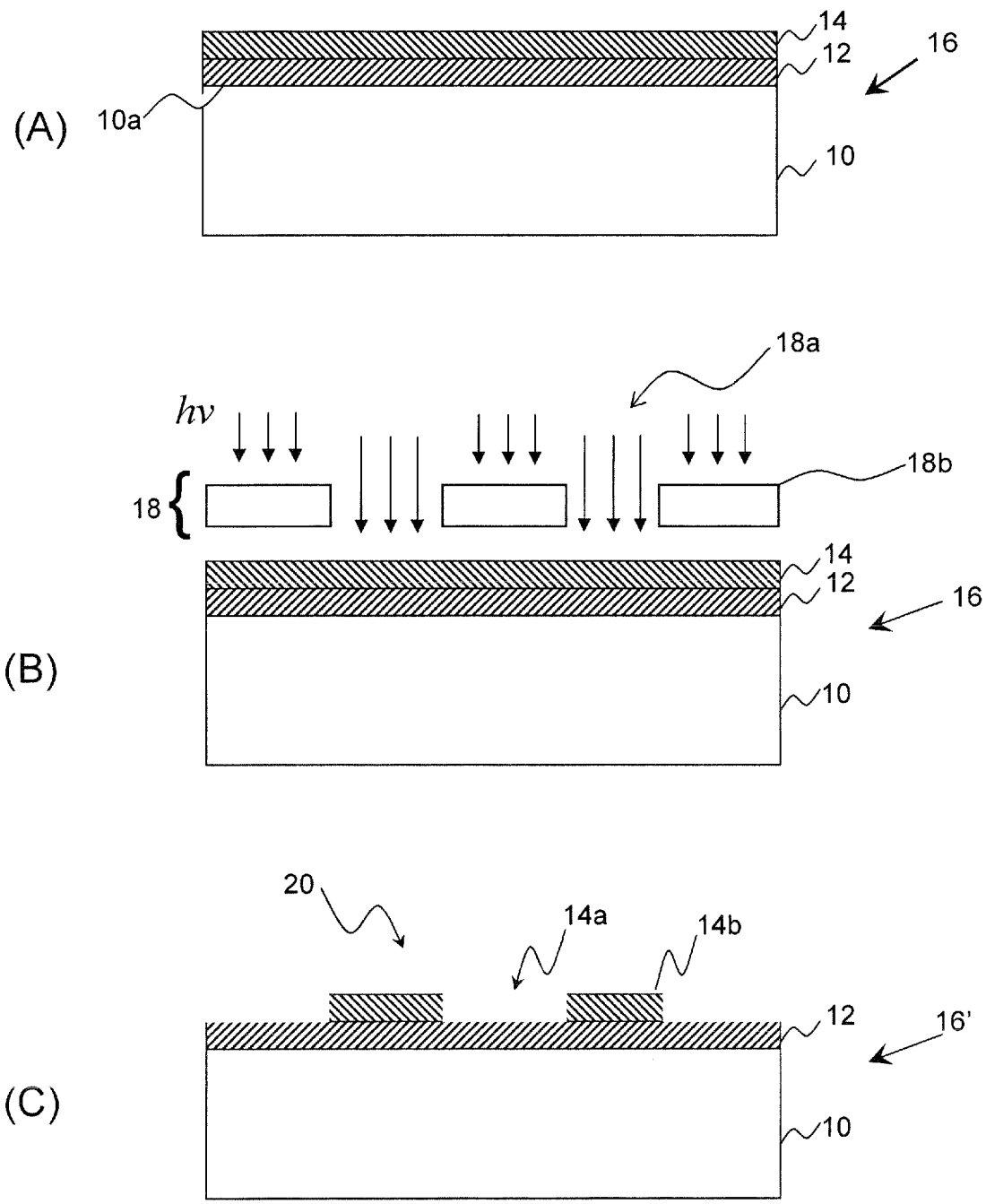

In more detail, a patternable sol-gel composition and method are provided. The invention described herein is based upon a novel approach to making radiation-sensitive sol-gel coatings using a base generator. Upon exposure to a radiation source, a base is generated by the base generator that induces highly efficient crosslinking without requiring extra functional groups commonly present in prior art coatings, which dramatically improves curing efficiency and makes high-efficiency patterning possible.

The inventive compositions comprise a sol-gel compound and a base generator dispersed or dissolved in a solvent system. The sol-gel compound is preferably present in the composition at a level of from about 90 to about 99.9% by weight, preferably from about 93 to about 99.5% by weight, and even more preferably from about 95 to about 99% by weight, based upon the total weight of the solids in the composition taken as 100% by weight. Suitable sol-gel compounds are polymers and/or oligomers prepared from acid-catalyzed polymerization of precursor materials such as alkoxysilanes, organic silanes, and the like. Exemplary precursor materials in one or more embodiments include

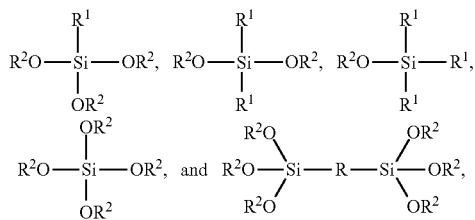

where each $R^1$ is individually selected from the group consisting of alkyls (preferably $C_1$-$C_{20}$ alkyls, more preferably $C_1$-$C_6$ alkyls), light attenuating moieties, and fluorocarbon moieties, and each $R^2$ is individually selected from the group consisting of alkyls (preferably $C_1$-$C_6$ alkyls, more preferably $C_1$-$C_2$ alkyls) and acetate groups.

A particularly preferred sol-gel oligomer or polymer will comprise recurring monomeric units of

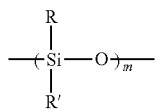

where m denotes a monomeric repeat unit without regard to distribution or position in the backbone, each R is individually selected from the group consisting of alkyls (preferably $C_1$-$C_{20}$ alkyls, more preferably $C_1$-$C_6$ alkyls), light attenuating moieties, fluorocarbon moieties, —OH, and each R' is a crosslinkable moiety. Exemplary crosslinkable moieties are individually selected from the group consisting of —OH, epoxy groups, and the like. Silanol functionalities (where R' is —OH) are particularly preferred in the present invention. In one or more embodiments, at least about 60% of the crosslinkable moieties are preferably —OH, more preferably from about 80% to about 100% of the crosslinkable moieties are —OH, and even more preferably from about 90% to about 100% of the crosslinkable moieties are —OH, based upon the total number of crosslinkable moieties taken as 100%. In one or more embodiments, the sol-gel compound is preferably essentially free of crosslinkable moieties other than —OH, such as epoxy functional groups, and the like. Thus, in some embodiments, less than about 3% of the crosslinkable moieties in the sol-gel compound are epoxy groups, more preferably less than about 1%, and more preferably less than about 0.1%, based upon the total number of crosslinkable moieties taken as 100%.

It will be appreciated that the properties of the sol-gel coatings can be customized by varying the functional group R pendant from the polymer or oligomer backbone. For example, suitable light attenuating moieties include aromatic groups, such as phenyl, naphthalene, anthracene, and/or carbazole. Such light attenuating moieties can be used to create high refractive index coatings. Likewise, exemplary fluorocarbon moieties, which can be used to create low refractive index coatings, include —$R^3CF_3$ and/or —$R^3(CF_2)_nCF_3$, where n is 1-20 (preferably 1-12), and each $R^3$ is individually selected from the group consisting of $C_1$-$C_3$ alkyls, and preferably $C_1$-$C_2$ alkyls.

Additional suitable oligomers and/or polymers for use in the invention also include compounds comprising silanol groups (as crosslinkable moieties) pendant from the oligomer or polymer backbone and/or silanol endcaps (as crosslinkable moieties). Such oligomers and/or polymer can be prepared by various methods, including, without limitation, free radical polymerization, step polymerization, and/or ring opening polymerization. Exemplary oligomers and/or polymers will have the structure

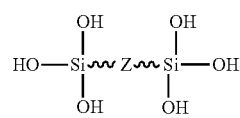

or comprise recurring monomeric units of

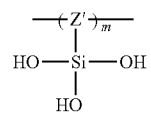

where m denotes a monomeric repeat unit without regard to distribution or position in the backbone, Z is a polymer or oligomer (endcapped with the —Si(OH)$_3$ groups), and Z' is the oligomer or polymer backbone.

Suitable base generators for use in the inventive compositions include any compounds that yield a base upon exposure to radiation, with photobase generators being particularly preferred. The base generators can be ionic or nonionic, although ionic base generators are particularly preferred. Exemplary ionic base generators will comprise a photosensitive anion ionically bound to a photosensitive protonated, strong base cation. Suitable photosensitive anions include, without limitation, $^\ominus BF_4$, $SCN^\ominus$, $SeCN^\ominus$,

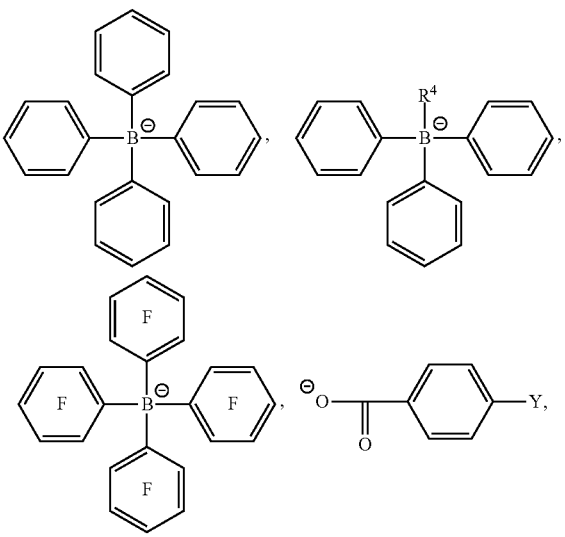

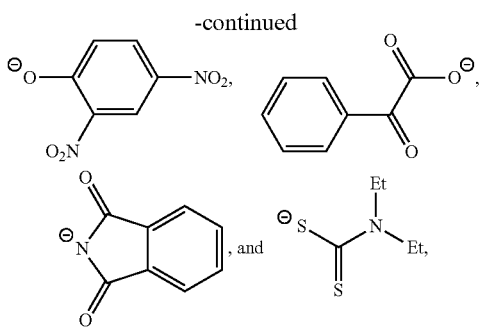

where $R^4$ is $C_nH_{2n+1}$, and Y is —H or $C(CH_3)_3$.

Suitable strong bases released from the cation include, without limitation:

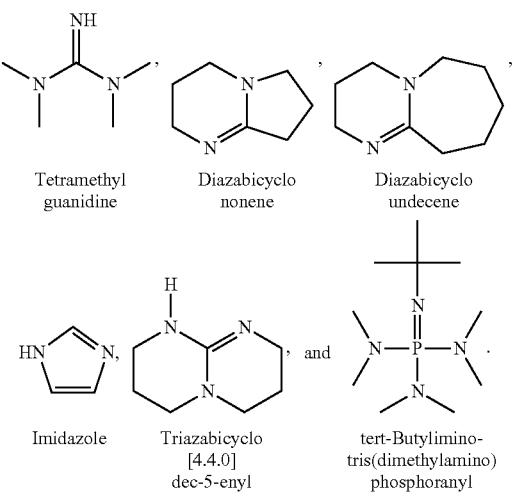

| Tetramethyl guanidine | Diazabicyclo nonene | Diazabicyclo undecene |

| Imidazole | Triazabicyclo [4.4.0] dec-5-enyl | tert-Butylimino-tris(dimethylamino) phosphoranyl |

A particularly preferred ionic base generator is bicyclic guanidinium tetraphenylborate.

Nonionic (covalent) base generators include various blocked amines, such as carbamates, O-acyloximes, amine-imides, α-aminoketones, amidine precursors, and aromatic ureas. Preferably, the base generator is one which releases a strong base upon irradiation, where a strong base is defined herein as a base having a pKa greater than about 9.5, more preferably greater than about 13, and even more preferably greater than about 25. In one or more embodiments, the base generator is essentially free of metals (i.e., comprises less than about 1 ppm, and preferably less than about 1 ppb metal on a total weight basis). Regardless of the embodiment, the base generator is preferably present in the composition at a level of from about 0.1 to about 10% by weight, preferably from about 0.5 to about 5% by weight, and even more preferably from about 1 to about 3% by weight, based upon the total weight of solids in the composition taken as 100% by weight.

Suitable solvent systems will include a solvent selected from the group consisting of propylene glycol monomethyl ether (PGME), propylene glycol monomethyl ether acetate (PGMEA), gamma-butyrolactone (GBL), and mixtures thereof. Preferably, the solvent system has a boiling point of from about 80 about 210° C., and more preferably from about 90 to about 205° C. The solvent system is preferably utilized at a level of from about 20 to about 99.9% by weight, preferably from about 30 to about 99% by weight, and even more preferably from about 40 to about 98% by weight, based upon the total weight of all ingredients in the composition taken as 100% by weight.

In some embodiments, the sol-gel composition consists essentially (or even consists) of the sol-gel compound and base generator dispersed or dissolved in the solvent system. In other words, the sol-gel composition is preferably free or essentially free (i.e., less than about 5% by weight and preferably less than about 3% by weight on a total weight basis) of other ingredients. However, in other embodiments, additional ingredients can optionally be included in the composition, such as acid quenchers (e.g., organic sulfonic acids, such as p-toluenesulfonic acid, phosphoric acid, as well as acid generators, such as traditional photoacid generators, such as triphenylsulfonium triflate), surfactants (ionic and/or non-ionic), and combinations thereof. When present, the acid quencher is preferably utilized at a level of from about 5 to about 30% by weight, preferably from about 10 to about 20% by weight, and even more preferably from about 10 to about 15% by weight, based upon the total weight of the base generator in the composition taken as 100% by weight. When present, a surfactant is preferably utilized at a level of from about 0.05 to about 3% by weight, preferably from about 0.05 to about 2% by weight, and even more preferably from about 0.1 to about 1% by weight, based upon the total weight of the sol-gel compound in the composition taken as 100% by weight.

It will be appreciated that the present invention provides a distinct advantage in that the use of crosslinking agents is not necessary. That is, the sol-gel compound (catalyzed by the base) provides the necessary curing and/or crosslinking in and of itself. The sol-gel composition preferably comprises less than about 3% by weight crosslinking agent, more preferably less than about 1% by weight crosslinking agent, and even more preferably less than about 0.1% by weight crosslinking agent, based upon the total weight of the solids taken as 100% by weight, and even more preferably is essentially free of crosslinking agents. The term "crosslinking agent" is used herein interchangeably with "crosslinker" and includes compounds such as aminoplasts, cresols, epoxies (other than those present on the sol-gel compound itself, when present), polyols, anhydrides, glycidyl ethers, vinyl ethers, melamines, glycolurils, benzoguanamines, and mixtures thereof.

The inventive compositions are formed by simply dispersing or dissolving the sol-gel compound and base generator in a suitable solvent system, preferably at ambient conditions and for a sufficient amount of time to form a substantially homogeneous dispersion or solution. Advantageously, the sol-gel composition, once formed, has a long shelf life and can be stored as a one-pot composition for a time period of at least about 1 month, preferably from about 1 to about 12 months, and more preferably from about 6 to about 12 months, when stored under ambient conditions (~23° C.). The "shelf life" of the composition is defined herein to mean the period of time that the composition can be stored without degrading, deteriorating, hardening, or otherwise losing its functionality as a coating or film (and particularly a patternable layer). In other words, the compositions, even after storage, can still be applied to a substrate and patterned without a noticeable difference in performance as compared to the performance of a coating formed from a freshly-prepared composition.

The sol-gel compositions are particularly useful in forming microelectronic structures. The sol-gel compositions advantageously can serve various roles in this process, depending upon the functionalization of the composition. For example, the inventive compositions are useful as hardmask layers, high or low refractive index layers, surface-roughening layers, barrier layers, and the like. Importantly, the inventive compositions can be directly patterned using lithography techniques.

FIGS. 1(A)-1(C) illustrate the formation of a multi-layer stack and patterning using the inventive sol-gel composition. In the method, a substrate 10 having a surface 10a is provided. Any microelectronic substrate can be used in the invention. Exemplary substrates 10 include those selected from the group consisting of silicon, SiGe, $SiO_2$, $Si_3N_4$, SiON, aluminum, tungsten, tungsten silicide, gallium arsenide, germanium, tantalum, tantalum nitride, coral, black diamond, phosphorous or boron doped glass, and mixtures of the foregoing. An optional intermediate layer 12 can be present or foil led on the surface 10a of the substrate as depicted in FIG. 1(A). The intermediate layer 12 can be formed by any known application method, with one preferred method being spin-coating the composition at speeds of from about 1,000 to about 3,000 rpm (preferably from about from about 1,250 to about 1,750 rpm) for a time period of from about 30 to about 120 seconds (preferably from about 45 to about 75 seconds). Suitable intermediate layers include those selected from the group consisting of spin-on carbon layers, amorphous carbon layers, bottom anti-reflective coatings, planarization layers, and combinations of the foregoing. Multiple intermediate layers can also be used (not shown). Regardless, the substrate 10 can also comprise a planar surface, or it can include topography (via holes, contact holes, raised features, etc.). As used herein, "topography" refers to the height or depth of a structure in or on a substrate surface 10a.

A layer of sol-gel composition is then formed adjacent the intermediate layer 12, when present, as shown in FIG. 1(A). When no intermediate layer 12 is present, the sol-gel layer is formed directly adjacent the substrate surface 10a (not shown). The sol-gel layer 14 can be formed by any known method of applying the sol-gel composition, with one preferred method being spin-coating the composition at speeds of from about 500 to about 5,000 rpm (preferably from about from about 800 to about 3,000 rpm) for a time period of from about 20 to about 120 seconds (preferably from about 30 to about 60 seconds). The sol-gel layer 14 can also be formed by spray-coating or printing. Regardless of the embodiment, after the sol-gel composition is applied, it is preferably heated to a temperature of from about 40° C. to about 100° C., and more preferably from about 50° C. to about 100° C. and for time periods of from about 30 seconds to about 120 seconds (preferably from about 20 seconds to about 60 seconds) to evaporate the solvent. It will be appreciated that the average thickness of the layer 14 will vary depending upon the desired end use (e.g., protective coatings vs. patternable layer). When used as a patternable coating, the average thickness (as measured over 5 spots) of the sol-gel layer 14 after baking is preferably from about 5 nm to about 1 mm, more preferably from about 15 nm to about 100 μm, and even more preferably from about 20 nm to about 10 μm. The resulting stack 16 is shown in FIG. 1(A).

As shown in FIG. 1(B), the sol-gel layer 14 can then be patterned by exposure to radiation of the appropriate dose followed by development of the unexposed portions of the layer 14. For patterning, the sol-gel layer 14 is exposed using a mask 18 positioned above the sol-gel layer 14. The mask 18 has open areas 18a designed to permit radiation (hv) to pass through the mask 18 and contact the sol-gel layer 14. The remaining solid portions 18b of the mask 18 are designed to prevent radiation from contacting the sol-gel layer 14 in certain areas. Those skilled in the art will readily understand that the arrangement of open areas 18a and solid portions 18b is designed based upon the desired pattern to be formed in the sol-gel layer 14.

The sol-gel layer 14 is preferably exposed to radiation (light) of a wavelength ranging from EUV (13.5 nm) to IR (750 nm). Advantageously, the sol-gel layer 14 can be patterned using low radiation dosages and exposure times. More specifically, the sol-gel layer 14 is preferably exposed to a dose of less than about 50 $mJ/cm^2$, more preferably from about 1 to about 20 $mJ/cm^2$, and even more preferably from about 1 to about 15 $mJ/cm^2$, for a time period of less than about 10 seconds, preferably from about 0.1 to about 5 seconds, and even more preferably from about 1 to about 3 seconds. After exposure, the sol-gel layer 14 is preferably subjected to a post-exposure bake at a temperature of from about 40° C. to about 130° C., more preferably from about 50° C. to about 120° C., for a time period of from about 20 seconds to about 60 seconds.

Figure 2:
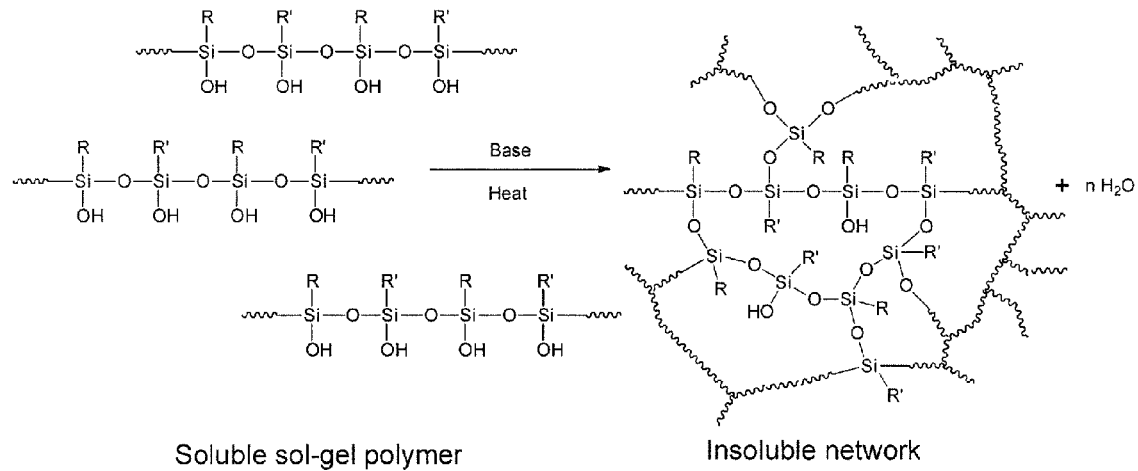
FIG. 2 is a reaction scheme of the crosslinking and curing of the sol-gel compositions upon exposure to radiation.

Upon exposure, the portions of the sol-gel layer 14 that are exposed to radiation are rendered insoluble in aqueous developer or solvent. More specifically, a base is generated from the base generator in the composition, and this base crosslinks the sol-gel compound in the layer. When a silanol group is on the polymer or oligomer, crosslinking results in the formation of siloxane crosslinkages having the formula —Si—O—Si— in the crosslinked network. This reaction is demonstrated in the scheme in FIG. 2. In one or more embodiments, the crosslinkages consist essentially (i.e., greater than about 90% of the crosslinkages are siloxanes, and preferably greater than about 95%, based upon the total crosslinkages taken as 100%), or even consist, of siloxane linkages.

As shown in FIG. 1(C), the unexposed portions 14a of the sol-gel layer 14 are then contacted with an aqueous developer or solvent to uncover the intermediate layer 12 if present, or substrate (if no intermediate layers are present) and leave behind the crosslinked exposed portions 14b of the sol-gel layer 14. At least about 95% of the unexposed portions 14a of the sol-gel layer 14 will preferably be removed by the developer or solvent, more preferably at least about 99%, and even more preferably about 100% will be removed. Suitable developers are organic or inorganic alkaline solutions such as KOH or tetramethylammonium hydroxide (TMAH), and preferably comprise an aqueous solution of TMAH at a concentration of 0.26N or lower. Some of these developers are commercialized under the tradenames PD523AD (available from Moses Lake Industries, Inc., Moses Lake, Wash.), MF-319 (available from Shipley, Mass.), MF-320 (available from Shipley), and NMD3 (available from TOK, Japan). Suitable solvents include any of the solvents used in forming the compositions, discussed above, as well as, ethyl lactate, cyclopentanone, cyclohexanone, MIBK, methyl ethyl ketone (MEK), n-butyl acetate, heptanones, or a mixture thereof.

The crosslinked portions 14b of the sol-gel layer 14 will be substantially insoluble in solvent or developer. Thus, when subjected to a stripping test, the crosslinked portions 14b of the sol-gel layer 14 will have a percent stripping of less than about 5%, preferably less than about 1%, and more preferably about 0%. The stripping test involves first determining the thickness by taking the average of measurements at five different locations of the layer. This is the initial average film thickness. Next, the film is rinsed with a solvent or developer for about 30 seconds, followed by spin drying at about 500-3,000 rpm for about 20-60 seconds to remove the solvent. The thickness is measured again at those five points on the wafer using ellipsometry, and the average of these measurements is determined. This is the average final film thickness.

The amount of stripping is the difference between the initial and final average film thicknesses. The percent stripping is:

$$\% \text{ stripping} = \left(\frac{\text{amount of stripping}}{\text{initial average film thickness}}\right) \times 100.$$

In some embodiments, the cured (crosslinked) sol-gel portions 14b preferably possess light absorbing properties at a wide range of wavelengths, including wavelengths of less than about 500 nm (e.g., 365 nm, 248 nm, 193 nm, 157 nm, or 13.5 nm). In other embodiments, the crosslinked sol-gel is preferably substantially transparent at the wavelength of exposure (e.g., 365 nm, 248 nm, 193 nm, 157 nm, or 13.5 nm).

Regardless of the embodiment, the pattern 20 that results from this process can be via holes, trenches, lines, spaces, etc. formed in and from the sol-gel layer 14. The patterned stack 16' is shown in FIG. 1(C). Advantageously, the inventive method can be used to form patterns having feature sizes of less than about 1 µm, preferably from about 10 nm to about 1 µm, more preferably from about 20 nm to about 500 nm. The "feature size," as used herein refers to the width of lines or trenches or the diameter of holes in or on the patterned layer, which are typically measured using SEM or optical microscope images. It will be appreciate that multiple different types of features having feature sizes within the above ranges can be formed using the inventive methods.

The patterned sol-gel layer 14 can serve as a hardmask to transfer the pattern 20 into subsequent layers 12 and ultimately the substrate 10 using an etch or ion implantation process. Advantageously, the patterned sol-gel layer 14 itself can also remain as a permanent structure in the ultimate device. It will be appreciated that since the sol-gel layer is itself patternable (i.e., patterning is carried out directly on the sol-gel layer), the methods are carried out and structures are formed without the use of a photoresist or other imaging layer in the stack 16. Thus, there are preferably no layers formed on top of the sol-gel layer 14 prior to patterning (exposure and development), as described above. However, it will be appreciated that additional layers may be formed adjacent the subsequently patterned sol-gel layer, depending upon the structure of the final device being formed. In addition, it will also be appreciated that since the pattern is formed directly in the present sol-gel composition, there is also no pattern transfer or wet/dry etching in the method or stack before the direct patterning of the sol-gel layer described above.

Although the invention has been described in detail with respect to patterning, it will be appreciated that the sol-gel materials described herein could be coated and crosslinked without the use of a mask. In other words, the sol-gel composition can also be used to form a coating or film that is not patterned using the lithography techniques described herein. In that case, the entire layer would be crosslinked and rendered insoluble in developer or solvent, as described above with respect to the exposed portions 14b of the sol-gel layer 14 depicted in FIGS. 1(A)-(C).

Additional advantages of the various embodiments of the invention will be apparent to those skilled in the art upon review of the disclosure herein and the working examples below. It will be appreciated that the various embodiments described herein are not necessarily mutually exclusive unless otherwise indicated herein. For example, a feature described or depicted in one embodiment may also be included in other embodiments, but is not necessarily included. Thus, the present invention encompasses a variety of combinations and/or integrations of the specific embodiments described herein.

In addition, while the drawings illustrate, and the specification describes, certain preferred embodiments of the invention, it is to be understood that such disclosure is by way of example only. Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. There is no intent to limit the principles of the present invention to the particular disclosed embodiments. For example, in the drawings, the size and relative sizes of layers and regions may be exaggerated for clarity. In addition, embodiments of the present invention should not be construed as limited to the particular shapes of regions illustrated herein but are to include deviations in shapes that result, for example, from manufacturing. For example, an etched region illustrated as a rectangle may have rounded or curved features. Thus, the regions illustrated in the figures are schematic in nature and their shapes are not necessarily intended to illustrate the precise shape of a region of a device, unless specifically indicated, and are not intended to limit the scope of the present invention.

As used herein, the phrase "and/or," when used in a list of two or more items, means that any one of the listed items can be employed by itself or any combination of two or more of the listed items can be employed. For example, if a composition is described as containing or excluding components A, B, and/or C, the composition can contain or exclude A alone; B alone; C alone; A and B in combination; A and C in combination; B and C in combination; or A, B, and C in combination.

The present description also uses numerical ranges to quantify certain parameters relating to various embodiments of the invention. It should be understood that when numerical ranges are provided, such ranges are to be construed as providing literal support for claim limitations that only recite the lower value of the range as well as claim limitations that only recite the upper value of the range. For example, a disclosed numerical range of about 10 to about 100 provides literal support for a claim reciting "greater than about 10" (with no upper bounds) and a claim reciting "less than about 100" (with no lower bounds).

EXAMPLES

The following examples set forth methods in accordance with the invention. It is to be understood, however, that these examples are provided by way of illustration and nothing therein should be taken as a limitation upon the overall scope of the invention.

Example 1

Synthesis of Sol-Gel Polymer 1

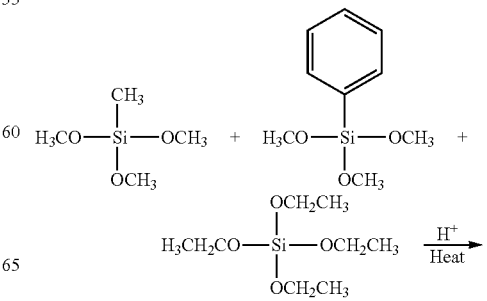

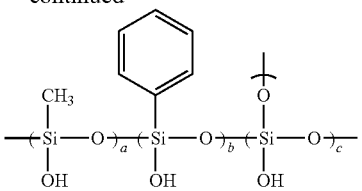

In this Example, a sol-gel polymer was prepared by adding 2.83 grams of phenyl trimethoxysilane (Gelest, Inc., Morrisville, Pa.), 17.22 grams of methyl trimethoxysilane (Gelest, Inc., Morrisville, Pa.), 7.43 grams of tetraethyl orthosilicate (TEOS, Gelest, Inc., Morrisville, Pa.), and 56.06 grams of propylene glycol monomethyl ether acetate (PGMEA, Ultra Pure Solutions, Inc., Castroville, Calif.) to a round bottom flask. Over a 10-minute period, 16.03 grams of a 3N acetic acid solution (17.6% acetic acid [Aldrich, St Louis, Mo.] and 82.4% water) were added to the flask while stirring. The round-bottom flask was fitted with a distillation head, distillation column, and collection flask. The solution was heated at 95° C. for 6-8 hours.

Example 2

Synthesis of 1,5,7-triazabicyclo[4.4.0]dec-5-enyltetraphenylborate

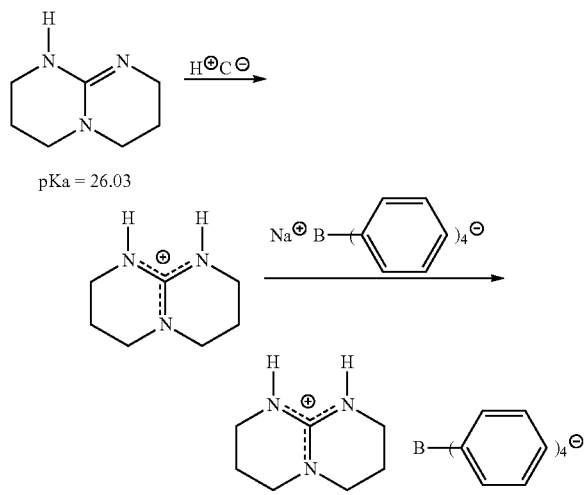

In this Example, an ionic base generator was synthesized. First, a base, 1,5,7-triazabicyclo[4.4.0]dec-5-ene (10 mmol, Aldrich, St. Louis, Mo.), was dissolved in 10 mL of 10% HCl (Aldrich; St. Louis, Mo.) aqueous solution, and then a solution of sodium tetraphenylborate (NaBPh$_4$, 10.5 mmol; Alfa Aesar; Ward Hill, Mass.) in 10 mL of water was added. The precipitate of the salt was filtered, washed several times with water, and washed with methanol (Aldrich). It was then recrystallized from a 4:1 mixture of methanol and chloroform (Aldrich), and dried under vacuum.

Example 3

Curing of Photosensitive Sol-Gel Coating 1

Figure 3:
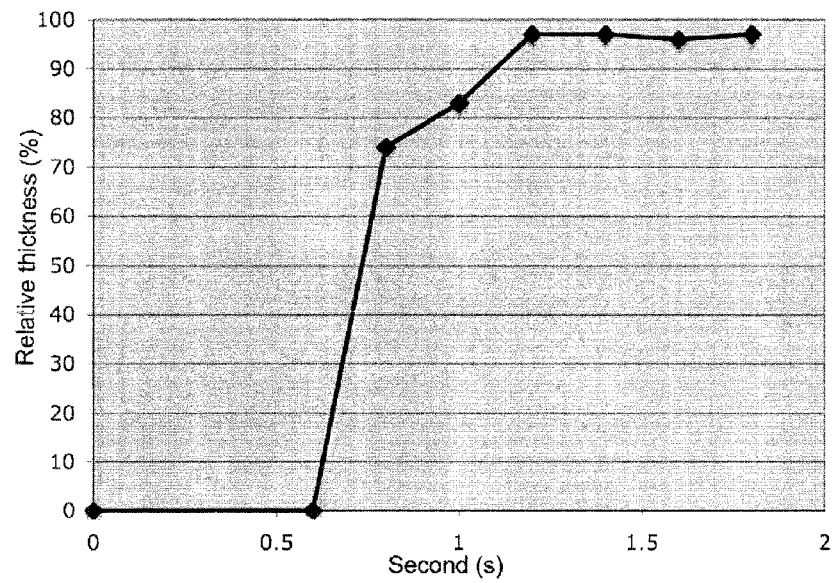
FIG. 3 is a graph showing the contrast curve of the photosensitive sol-gel coating in Example 3.

A photosensitive sol-gel composition was prepared by mixing 4.0 grams of Sol-gel Polymer 1 with 2.0 grams of 0.25 wt % of 1,5,7-triazabicyclo-[4.4.0]dec-5-enyltetraphenylborate in propylene glycol monomethyl ether (PGME, Ultra Pure Solutions Inc., Castroville, Calif.) in 12.0 grams of PGME. The resulting solution was filtered using a PTFE filter with a pore size of 100 nm, and then spin-coated onto a four inch silicon wafer at a speed of 1,500 rpm. The resulting coating had a thickness of 70 nm. The coated wafer was then baked at 100° C. for 60 seconds, and exposed to ultraviolet (UV) light using an Oriel broadband UV light source (14.8 mJ/cm$^2$) for various time periods. The exposed wafer was then baked at 100° C. for 60 seconds, and developed using PD532AW (Moose Lake Chemicals, Moose Lake, Wash.) for 30 seconds. The wafer was then rinsed with deionized water, and spin-dried. The coating thickness was measured, and divided by the initial thickness (70 nm) to obtain the relative thickness. The relative thickness of coating versus time of exposure is depicted in FIG. 3, which demonstrates that the material can be cured at very short exposure time (<1.5 seconds) with a low temperature bake (100° C.).

Example 4

Shelf Life of Sol-Gel Coating 1

Sol-Gel Coating 1, prepared according to Example 3, was stored in a sealed bottle at room temperature for three months. The formulating was then spin-coated onto a four-inch silicon wafer at a speed of 1,500 rpm. The thickness of resulting layer was measured to be 70 nm, and no significant change in the coating thickness was observed.

Example 5

Patterning of Sol-Gel Coating 1

Figure 4:
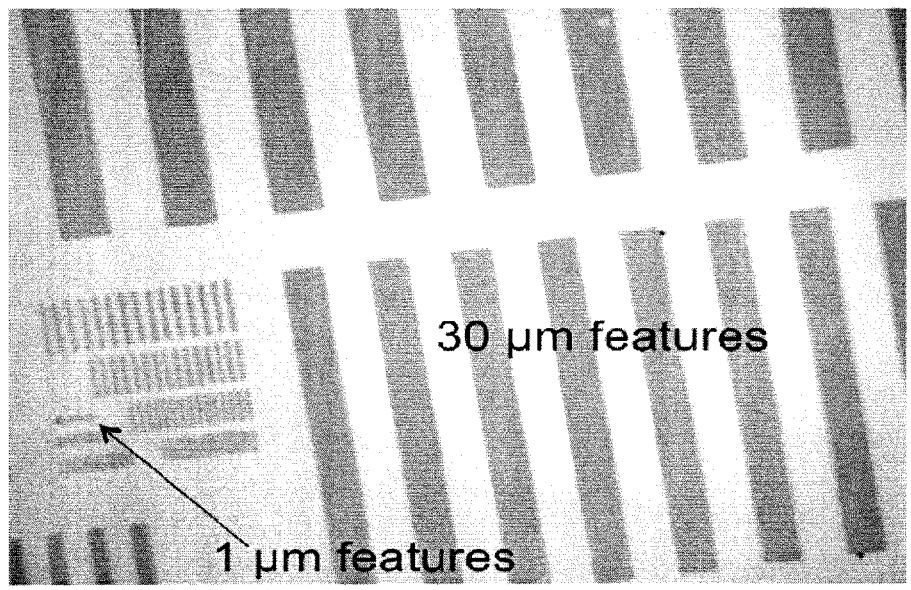
FIG. 4 is an image of patterned Sol-Gel Coating 1 from Example 5, taken with an optical microscope.

A patterned substrate was formed using a coated wafer prepared and exposed according to the procedures in Example 3. A mask was placed between the coated wafer and the UV light source. The exposure time was 5 seconds. After exposure, the wafer was baked at 100° C. for 60 seconds, followed by washing with developer (PD532AW) for 60 seconds. The wafer was then rinsed with deionized water and spin-dried. The pattern on the mask was transferred to the sol-gel coating. FIG. 4 shows a pattern as viewed with an optical microscope (1600× magnification), showing features as small as 1 micron.

Example 6

Patterning of Sol-Gel Coating 1 on top of Antireflective Underlayer

Figure 5:
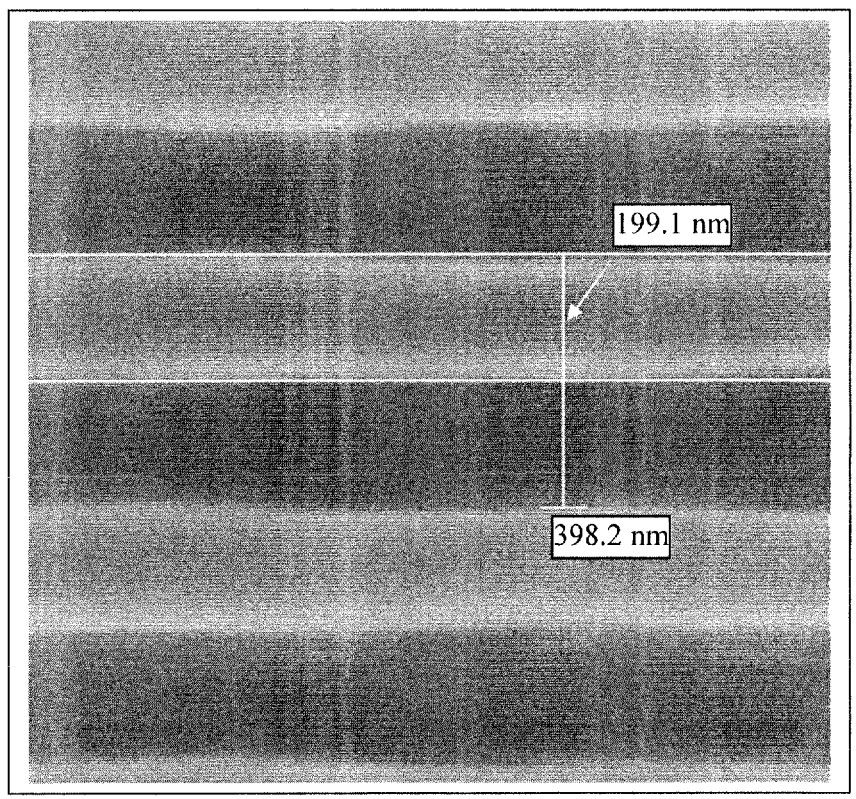
FIG. 5 is an SEM image of patterned Sol-Gel Coating 1 on top of an anti-reflective coating from Example 6.
Figure 6:
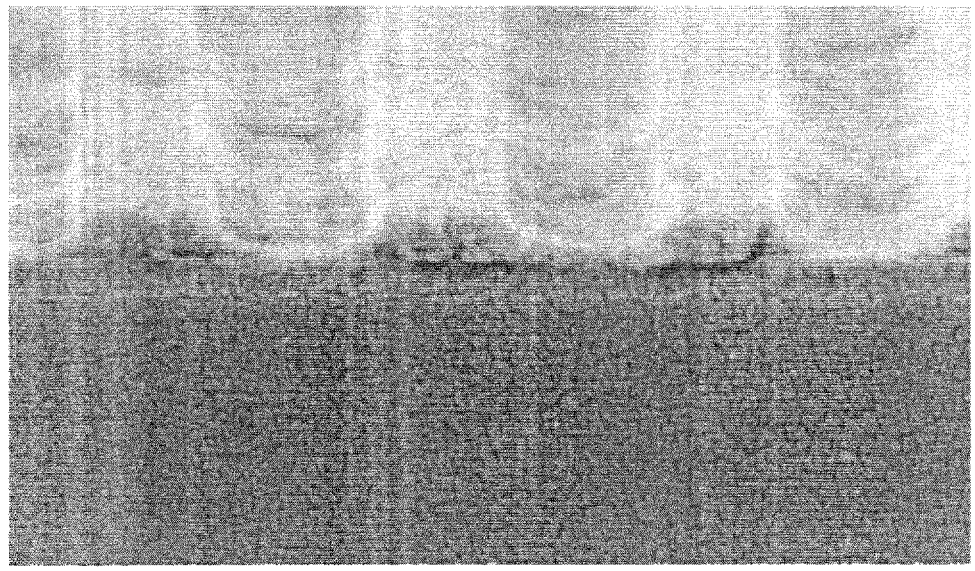
FIG. 6 is an SEM cross-section image of the patterned Sol-Gel Coating in FIG. 5.

An antireflective coating (DUV42; Brewer Science Inc, Rolla, Mo.) was spin-coated onto a wafer and baked at 205° C. for 60 seconds. Sol-Gel Coating 1, prepared in Example 3, was spin-coated on top of the cured DUV42 coating to create a layer adjacent the antireflective coating, and then baked at 100° C. The coated wafer was then exposed to 248-nm light from an Amphibian Exposer for different time periods, and then developed using PD532AW. FIG. 5 shows a top-down SEM picture (200,000× magnification) and FIG. 6 shows an SEM cross-section (200,000× magnification) of the patterned wafer, which demonstrate 200-nm lines.

Example 7

Photosensitive Sol-Gel Coating 2

Figure 7:
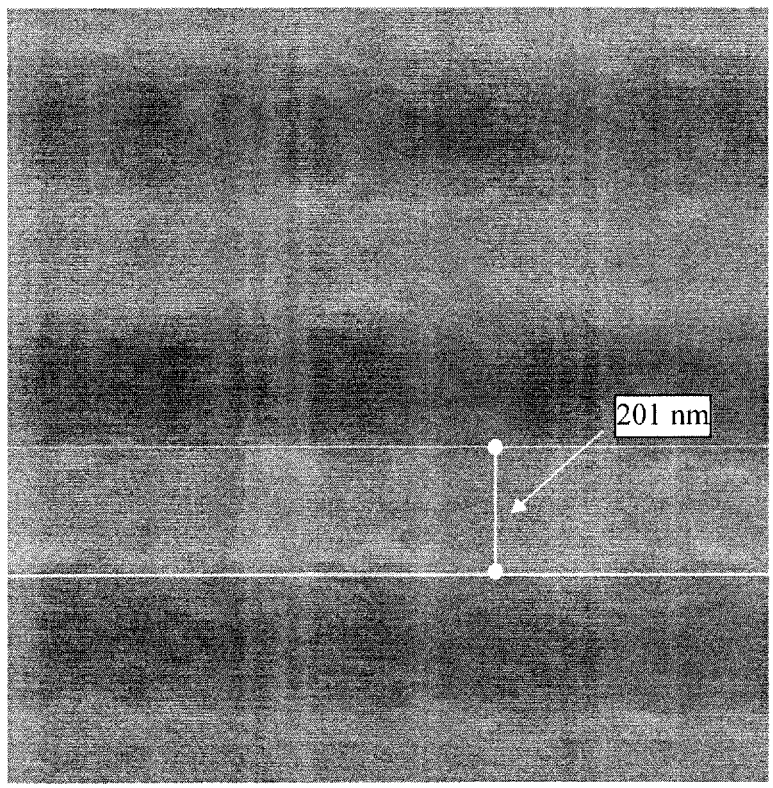
FIG. 7 is an SEM image of patterned Sol-Gel Coating 2 from Example 7.
Figure 8:
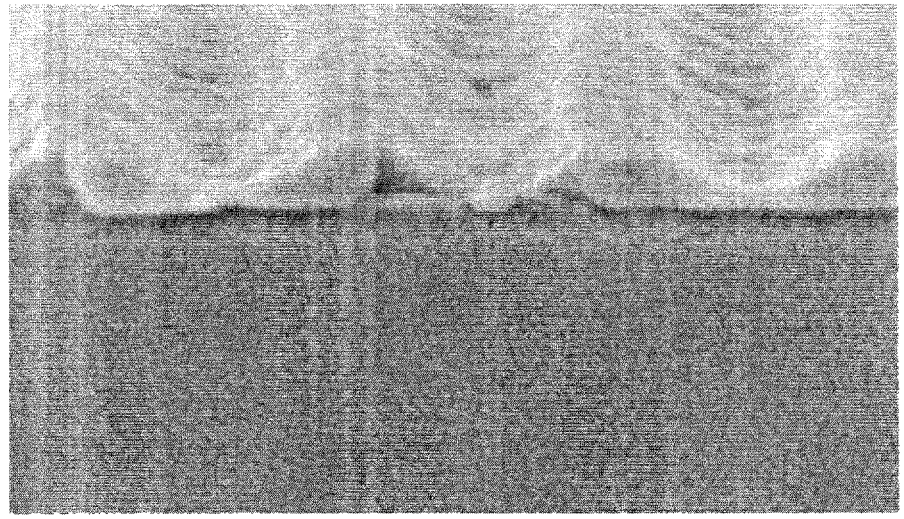
FIG. 8 is an SEM cross-section image of the patterned Sol-Gel Coating 2 in FIG. 7.

A photosensitive sol-gel composition was prepared by mixing 4.0 grams of Sol-gel Polymer 1 with 4.0 grams of 0.25 wt % 1,5,7-triazabicyclo[4.4.0]dec-5-enyltetraphenylborate in PGME, and 12.0 grams of PGME. The resulting solution was then filtered using a PTFE filter with a pore size of 100 nm, and then spin-coated onto a four-inch silicon wafer at a speed of 1,500 rpm. The resulting coating had a thickness of 70 nm. The coated wafer was then baked at 100° C. for 60 seconds, and exposed to ultraviolet (UV) light using an Oriel broadband UV light source (14.8 mJ/cm²) for various time periods. A mask was placed between the coated wafer and the UV light source. The exposure time was 5 seconds. After exposure, the wafer was baked at 100° C. for 60 seconds, washed with developer (PD532AW) for 60 seconds, rinsed with deionized water, and then spin-dried. The pattern on the mask was transferred to the sol-gel coating. FIG. 7 shows a top-down SEM picture (200,000× magnification), and FIG. 8 shows a SEM cross-section (200,000× magnification), which demonstrate 200-nm lines.

Example 8

Photosensitive Sol-Gel Coating 3

Figure 9:
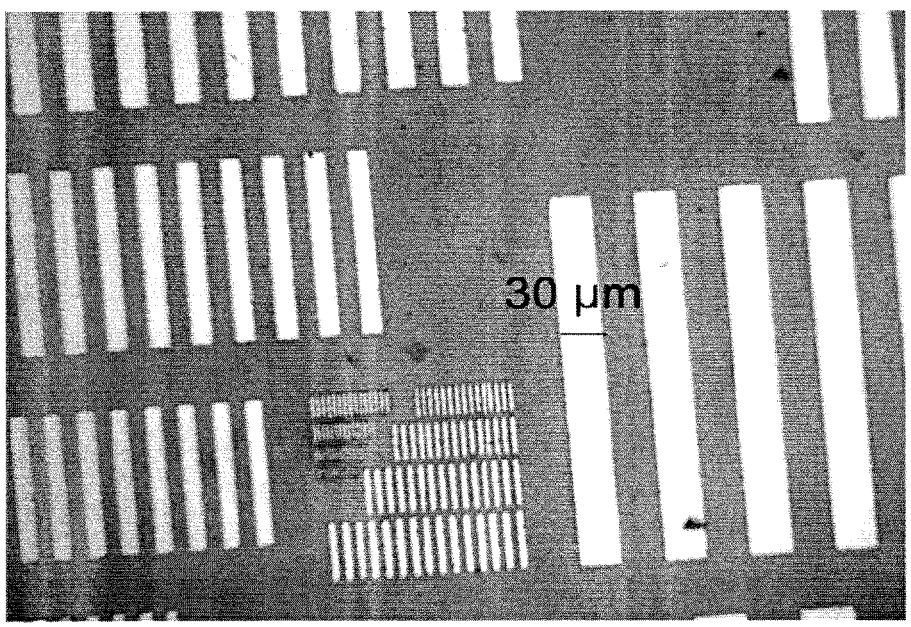
FIG. 9 is an image of patterned Sol-Gel Coating 3 from Example 8, taken with an optical microscope.

A photosensitive sol-gel composition was prepared by mixing 4.0 grams of Sol-Gel Polymer 1, 4.0 grams of 0.25 wt % of 1,5,7-triazabicyclo[4.4.0]dec-5-enyltetraphenylborate in PGME, 3.0 grams of p-toluenesulfonic acid (PTSA, Aldrich, St Louis, Mo.) in PGME solution, and 3.0 grams of PGME. The resulting solution was filtered using a PTFE filter with a pore size of 100 nm and then spin-coated onto a four-inch silicon wafer at a speed of 1,500 rpm. The coated wafer was baked at 100° C. for 60 seconds, and then exposed to ultraviolet (UV) light using an Oriel broadband UV light source for various time periods. The exposed wafer was baked at 100° C. for 60 seconds, and then developed using PD532AW for 60 seconds. The wafer was rinsed with deionized water, and spin-dried. FIG. 9 shows the patterned sol-gel layer as viewed with an optical microscope (1600× magnification).

Example 9

Synthesis of 193-nm Light-Transparent Sol-Gel Polymer

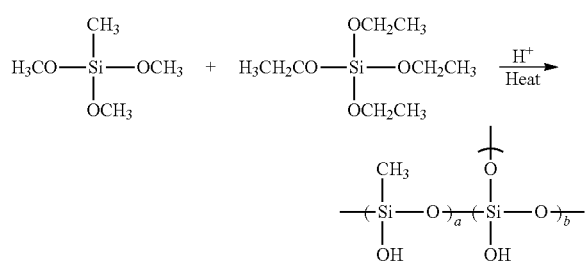

A light-transparent sol-gel polymer was prepared by adding 8.0 grams of methyl trimethoxysilane, 20.8 grams tetraethyl orthosilicate, and 50.0 grams of PGMEA to a round-bottom flask. Over a 10-minute period, 22.0 grams of a 3N acetic acid solution were added to the flask while stirring. The round-bottom flask was then fitted with a distillation head, distillation column, and collection flask. The solution was heated at 95° C. for 6 hours.

Example 10

Pattern 193-nm Light-Transparent Sol-Gel Polymer

Figure 10:
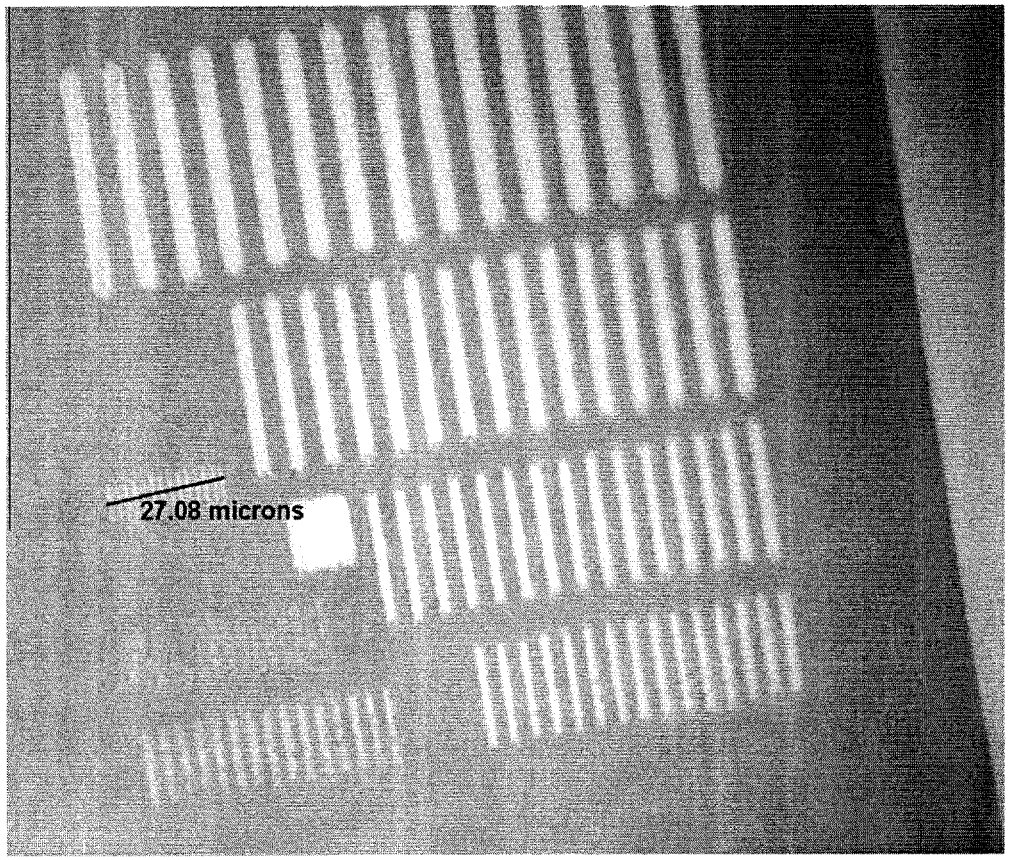
FIG. 10 is an image of a patterned light-transparent sol-gel coating on top of a spin-on carbon layer from Example 10, taken with an optical microscope.

A wafer stack was prepared by spin-coating a spin-on carbon (OptiStack SOC110D; Brewer Science Inc, Rolla, Mo.) onto a wafer, followed by baking at 205° C. for 60 seconds. The light-transparent sol-gel polymer from Example 8 was then spin-coated on top of the cured SOC layer to form a sol-gel layer adjacent the SOC layer, followed by baking at 100° C. for 60 seconds. The stack was then exposed to ultraviolet (UV) light using an Oriel broadband UV light source (14.8 mJ/cm²) for various time periods. A mask was placed between the coated wafer and the UV light source to pattern the sol-gel layer. The exposure time was 5 seconds. After exposure, the wafer was baked at 100° C. for 60 seconds, and then washed with developer (PD532AW) for 60 seconds. The wafer was then rinsed with deionized water, and spin-dried. FIG. 10 shows the patterned sol-gel layer as viewed with an optical microscope (1600× magnification).

Example 11

Synthesis of Low Refractive Index Sol-Gel Polymer

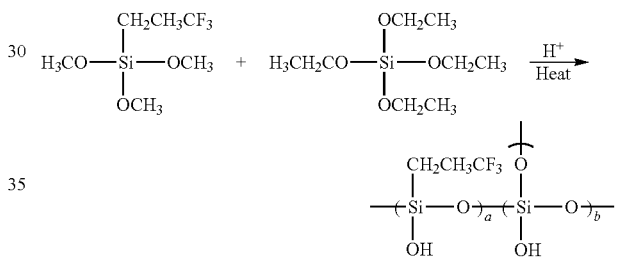

A low refractive index sol-gel polymer was prepared by adding 15.0 grams of (3,3,3-trifluoropropyl) trimethoxysilane (Gelest, Inc., Morrisville, Pa.), 75.0 grams tetraethyl orthosilicate, and 10.5 grams of PGMEA to a round-bottom flask. Over a 10-minute period, 10.51 grams of a 3N acetic acid solution were added to the flask while stirring. The round-bottom flask was fitted with a distillation head, distillation column, and collection flask. The solution was heated at 95° C. for 6 hours.

Example 12

Photosensitive, Low Refractive Index Coating 1

Figure 11:
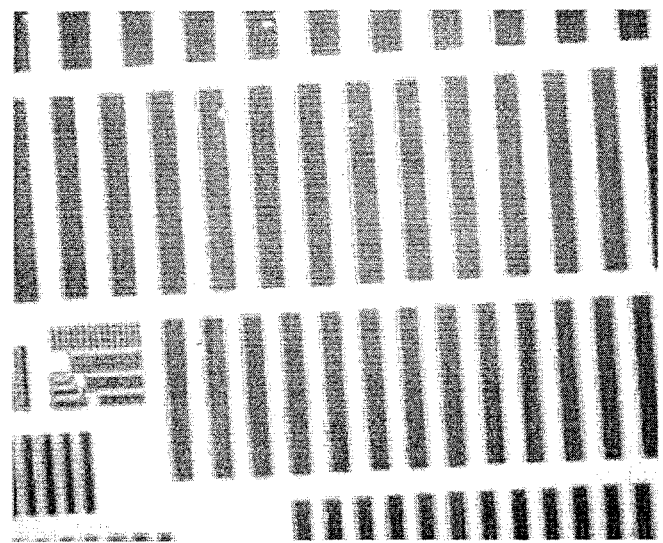
FIG. 11 is an image of patterned Photosensitive Low Refractive Index Coating 1 from Example 12, taken with an optical microscope.

A photosensitive, low refractive index sol-gel coating was prepared by mixing 9.0 grams of the sol-gel polymer from Example 8 with 3.0 grams of 0.25 wt % of 1,5,7-triazabicyclo-[4.4.0]dec-5-enyltetraphenylborate in PGME. The resulting solution was filtered using a PTFE filter with a pore size of 100 nm, and then spin-coated onto a four-inch silicon wafer at a speed of 500 rpm to produce a coating with a thickness of 200 nm. The refractive index of coating was measured to be 1.28 at 633 nm using an ellipsometer. The coated wafer was then exposed to ultraviolet (UV) light using an Oriel broadband UV light source for various time periods. The exposed wafer was then baked at 60° C. for 60 seconds and developed using PGME for 60 seconds. The wafer was then rinsed with PGME and spin-dried. FIG. 11 shows the resulting pattern as viewed with an optical microscope (1600× magnification).

Example 13

Photosensitive, Low Refractive Index Coating 2

Figure 12:
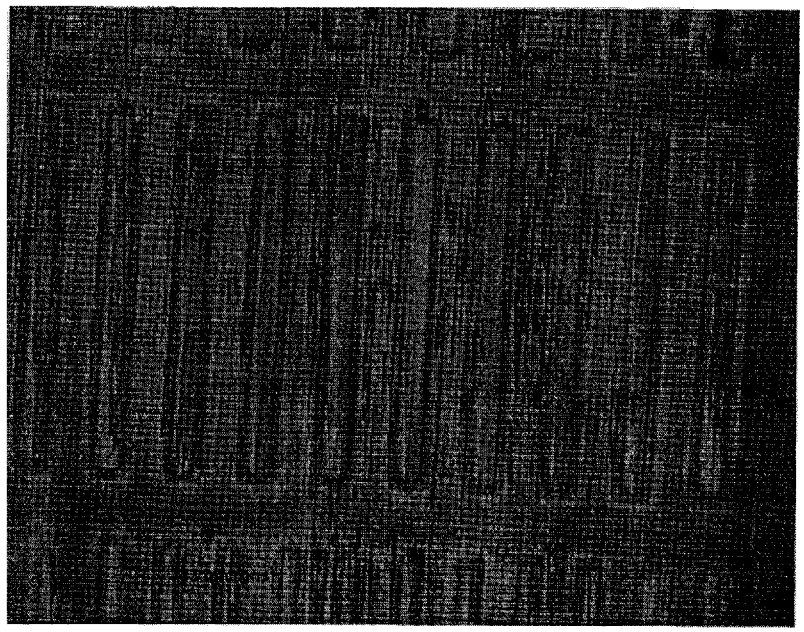
FIG. 12 is an image of patterned Photosensitive Low Refractive Index Coating 2 from Example 13, taken with an optical microscope.

A photosensitive, low refractive index sol-gel coating was prepared by mixing 12.0 grams of the sol-gel polymer from Example 10, with 3.0 grams of 0.25 wt % of 1,5,7-triazabicyclo[4.4.0]dec-5-enyltetraphenylborate in PGME, and 1.5 grams 0.05 wt % PTSA in PGME. The resulting solution was filtered using a PTFE filter with a pore size of 100 nm and was spin-coated onto a four-inch silicon wafer at a speed of 500 rpm to produce a coating with a thickness of 400 nm. The refractive index of coating was measured to be 1.28 at 633 nm using an ellipsometer. The coated wafer was then exposed to ultraviolet (UV) light using an Oriel broadband UV light source for various time periods. The exposed wafer was then baked at 60° C. for 60 seconds and developed using PGMEA for 60 seconds. The wafer was then rinsed with PGMEA, and spin-dried. FIG. 12 shows the resulting pattern as viewed with an optical microscope (1600× magnification).

We claim:

1. A method of forming a microelectronic structure, said method comprising:
providing a substrate having a surface;
optionally forming an intermediate layer on said surface;
forming a layer of sol-gel composition adjacent said intermediate layer, if present, or adjacent said substrate surface if no intermediate layers are present, said sol-gel composition comprising a sol-gel compound and a base generator dissolved or dispersed in a solvent system;
exposing said sol-gel layer to radiation to yield exposed and unexposed portions of said sol-gel layer; and
contacting said sol-gel layer with a solvent or aqueous alkaline developer so as to remove said unexposed portions and yield a patterned sol-gel layer, said patterned sol-gel layer comprising a pattern, said pattern comprising features having a feature size of less than about 1 µm.

2. The method of claim 1, wherein said features are selected from the group consisting of via holes, lines, trenches, spaces, and combinations thereof.

3. The method of claim 1, wherein said exposing results in crosslinking said exposed portions of said sol-gel layer.

4. The method of claim 3, wherein said crosslinked exposed portions comprise crosslinkages having the formula —O—Si—O—.

5. The method of claim 1, said sol-gel layer having an initial solubility in a developer or solvent, wherein after said exposing, said exposed portions of said sol-gel layer has a final solubility in developer or solvent, said final solubility being less than said initial solubility.

6. The method of claim 1, wherein said sol-gel compound is a polymer and/or oligomer prepared of an alkoxysilane, organic silane, compounds having pendant silanol groups, or a combination thereof.

7. The method of claim 1, said sol-gel compound comprising recurring monomeric units comprising silicon and having crosslinkable moieties bonded to said silicon.

8. The method of claim 7, wherein at least about 60% of said crosslinkable moieties are —OH groups, based upon the total number of crosslinkable moieties taken as 100%.

9. The method of claim 7, wherein less than about 3% of the crosslinkable moieties in the sol-gel compound are epoxy groups, based upon the total number of crosslinkable moieties taken as 100%.

10. The method of claim 1, wherein during said exposing, said base generator releases a base having a pKa of greater than about 9.5.

11. The method of claim 1, wherein said base generator is an ionic base generator comprising an anion and a protonated strong base cation.

12. The method of claim 11, wherein said anion is tetraphenylborate, and wherein said cation is tetramethyl guanidine, diazabicyclo nonene, diazabycyclo undecene, imidazole, triazabicyclo[4,4,0]dec-5-ene, or (tert-butylimino-tris(dimethylamino)phosphoranyl.

13. The method of claim 1, wherein said exposing comprises subjecting said sol-gel layer to radiation of less than about 50 mJ/cm$^2$, for a time period of less than about 10 seconds.

* * * * *